United States Patent
Rey-Losada (10) Patent No.: US 9,431,971 B2
(45) Date of Patent: Aug. 30, 2016

(54) REDUCED-POWER DISSIPATION FOR CIRCUITS HANDLING DIFFERENTIAL PSEUDO-DIFFERENTIAL SIGNALS

(71) Applicant: ANALOG DEVICES, INC., Norwood, MA (US)

(72) Inventor: Daniel Rey-Losada, San Diego, CA (US)

(73) Assignee: ANALOG DEVICES, INC., Norwood, MA (US)

(*) Notice: Subject to any disclaimer, the term of this patent is extended or adjusted under 35 U.S.C. 154(b) by 0 days.

(21) Appl. No.: 14/304,093

(22) Filed: Jun. 13, 2014

(65) Prior Publication Data

US 2015/0365055 A1     Dec. 17, 2015

(51) Int. Cl.
*H03F 1/26* (2006.01)
*H03F 3/45* (2006.01)

(52) U.S. Cl.
CPC .............. *H03F 1/26* (2013.01); *H03F 3/4508* (2013.01); *H03F 2200/372* (2013.01); *H03F 2203/45112* (2013.01)

(58) Field of Classification Search
USPC .................................................. 330/252–261
See application file for complete search history.

(56) References Cited

U.S. PATENT DOCUMENTS

| | | | |
|---|---|---|---|
| 7,088,179 B2 | 8/2006 | Gilbert et al. | |
| 7,215,201 B2 * | 5/2007 | Roine | H03F 3/45264 330/255 |
| 7,327,190 B2 | 2/2008 | D'Abramo et al. | |
| 7,656,231 B2 | 2/2010 | Luo et al. | |
| 7,936,218 B1 * | 5/2011 | Lautzenhiser | H03F 1/0211 330/124 R |
| 7,944,307 B2 * | 5/2011 | Goldfarb | H03F 1/483 330/290 |
| 8,049,214 B2 | 11/2011 | Marshall | |
| 8,130,035 B2 | 3/2012 | Weigandt et al. | |
| 8,717,103 B2 * | 5/2014 | Leong et al. | 330/302 |

* cited by examiner

*Primary Examiner* — Hieu Nguyen
(74) *Attorney, Agent, or Firm* — Patent Capital Group (57) ABSTRACT

In an example, a differential amplifier is disclosed that is configured to realize low noise with decreased overall system current. The differential amplifier may include a first amplifier stage and a second amplifier stage arranged in series, wherein a pull-up current $i_H$ flowing as a single bias current $i_B = i_H$ flows into the first stage. A single pull-down current $i_T$ sources to ground from the second stage, wherein $i_H = i_T = i_B$ substantially. In certain embodiments, the transconductance of the second stage may be increased by providing two transconductors coupled at their base nodes.

23 Claims, 8 Drawing Sheets

FIG. 9

REDUCED-POWER DISSIPATION FOR CIRCUITS HANDLING DIFFERENTIAL PSEUDO-DIFFERENTIAL SIGNALS

FIELD OF THE DISCLOSURE

This application relates to the field of electronics, and more particularly to reduced power dissipation in circuits handling differential or pseudo-differential signals.

BACKGROUND

Amplifiers are a class of electrical circuits that accept an input signal $v_{in}$ and provide as an output a scaled version of the input signal $v_{out}=A\cdot v_{in}$, where A is the gain, and $v_{out}$ and $v_{in}$ are provided as non-limiting example signals. Amplification is often realized using a species of transconductor, such as a transistor. In "single-ended" amplifiers, $v_{in}$, is a single ground- or common-referenced signal, and $v_{out}$ is similarly ground- or common-referenced. In a differential amplifier, either the received $v_{in}$ or the produced $v_{out}$ is a signal encoded as the difference between two signal branches, also known as differential signal. In some differential amplifiers, a single-ended $v_{in}$ may be converted to a differential $v_{out}$.

In many amplifiers, undesirable noise may be minimized by increasing the transconductance of the transconductors within the amplifier, which is commonly accomplished by increasing the bias current $i_B$ provided to the transconductors. A common practice in differential amplifiers is to provide a substantially symmetrical circuit, where two branches "mirror" one another as is the case in a differential pair. A single "tail" current $i_T$ may be drawn by a single pull-down current source from both branches. By setting $i_T=2i_B$ substantially, it can be ensured that a relatively constant and predictable bias current $i_B$ is provided to each branch.

BRIEF DESCRIPTION OF THE DRAWINGS

The present disclosure is best understood from the following detailed description when read with the accompanying figures. It is emphasized that, in accordance with the standard practice in the industry, various features are shown in a particular scale by way of example only. The scales shown are not intended to be limiting, and in various embodiments, the scales may be increased or decreased to meet design requirements.

OVERVIEW

There is disclosed in a first example a two-branch amplifier circuit comprising a first-branch transconductance and a second-branch transconductance electrically coupled to the first-branch transconductance; wherein the electrical coupling is disposed so that a current $i_H$ flowing into the first-branch transconductance as a bias current $i_{B1}$, where $i_{B1}=i_H$, is provided substantially to the second-branch transconductance as a bias current $i_{B2}=i_{B1}$.

There is disclosed in a second example an integrated circuit comprising a semiconductor die comprising a first-branch transconductance and a second-branch transconductance electrically coupled to the first-branch transconductance; wherein the electrical coupling is disposed so that a current $i_H$ flowing into the first-branch transconductance as a bias current $i_{B1}$, where $i_{B1}=i_H$, is provided substantially to the second-branch transconductance as a bias current $i_{B2}=i_{B1}$.

There is disclosed in a third example an electronic system comprising a signal source; a signal load; an input-stage amplifier electrically coupled to the signal source and configured to amplify the signal source and provide the amplified signal to the signal load, the amplifier comprising a first-branch transconductance and a second-branch transconductance electrically coupled to the first-branch transconductance, wherein the electrical coupling is disposed so that a current $i_H$ flowing into the first-branch transconductance as a bias current $i_{B1}$, where $i_{B1}=i_H$, is provided substantially to the second-branch transconductance as a bias current $i_{B2}=i_{B1}$; and an output stage having a positive supply voltage and a negative supply voltage, wherein the positive supply voltage and negative supply voltage are shared between the input-stage amplifier and the output stage.

EXAMPLE EMBODIMENTS OF THE DISCLOSURE

The following disclosure provides many different embodiments, or examples, for implementing different features of the present disclosure. Specific examples of components and arrangements are described below to simplify the present disclosure. These are, of course, merely examples and are not intended to be limiting. Further, the present disclosure may repeat reference numerals and/or letters in the various examples. This repetition is for the purpose of simplicity and clarity and does not in itself dictate a relationship between the various embodiments and/or configurations discussed.

Different embodiments may have different advantages, and no particular advantage is necessarily required of any embodiment.

According to certain examples of the present Specification, a differential amplifier may be constructed to receive a differential input signal, and to provide a differential output signal. Other embodiments may include "single-ended" inputs and/or outputs.

In constructing such an amplifier, it is beneficial in certain cases to provide an increased bias current through the transconductors to reduce noise in the amplifier or increase speed of the amplifier. However, a competing design consideration is that increasing bias current also increases the overall power dissipation of the amplifier. Thus, it is desirable and beneficial to increase the bias current available to transconductors without increasing overall power dissipation of the circuit.

As used throughout this Specification, a "transconductor" includes any non-passive device with three or more nodes configured to provide a transconductance or transconductance effect, characterized for example by $$g_m = \frac{\partial I_{out}}{\partial V_{in}} \text{ or } g_m = \frac{i_{out}}{v_{in}}.$$

Transconductors include any solid-state transistors, including bipolar junction transistors (BJT), field-effect transistors (FETs), metal-oxide FETs (MOSFETs), junction FETs (JFETs), triodes, vacuum tubes, voltage-to-current converters, and amplifiers by way of non-limiting example. For ease of reference, all such devices are referred to herein generically as transconductors. In general, a transconductor will have at least three nodes, which can be referred to as a first node (base, gate, input, or similar), second node (source, emitter, or similar), and third node (drain, collector, or similar). It is expressly intended that any reference node to an input node, in particular, be construed as encompassing any of a base node, gate node, or the equivalent in a transconductor that has neither a base node nor a gate node. References to other transconductor nodes are intended to be similarly broad with respect to equivalent nodes. In many disclosed examples, one type of transistor, such as a "p-type" transistor, may be trivially substituted for another transistor, such as an "n-type" transistor by rearranging polarities in a circuit design. Thus, unless expressly stated otherwise, it is intended herein that, for example, a design employing an n-type MOSFET be considered the equivalent of a similar design employing a pnp-type BJT with appropriate modifications.

Throughout the figures, certain voltage reference terms are used by way of example only, and should be understood in that context. For example, certain example circuits may include a positive node $V^+$, $V_{DD}$, or $V_{CC}$ and a negative node $V^-$, $V_{SS}$, or $V_{EE}$. Nodes $V^+$ and $V^-$ both have many possible values. By convention, $V^+$ is spoken of as being the most "positive" voltage and $V^-$ is spoken of as being the most "negative" voltage. Thus, under appropriate circumstances, either $V^+$ or $V^-$ could be considered a "supply" or "positive" voltage, and under other circumstances, either $V^+$ or $V^-$ could be considered a "ground," "negative," or "negative supply" voltage. It should be noted that $V^-$ need be neither an absolute ground ("earth" or "chassis"), nor necessarily negative with respect to earth or chassis ground. Furthermore, "positive" and "negative" may be understood to refer simply to two opposite ends of a difference in potential, which may be of opposite polarity.

Figure 1:
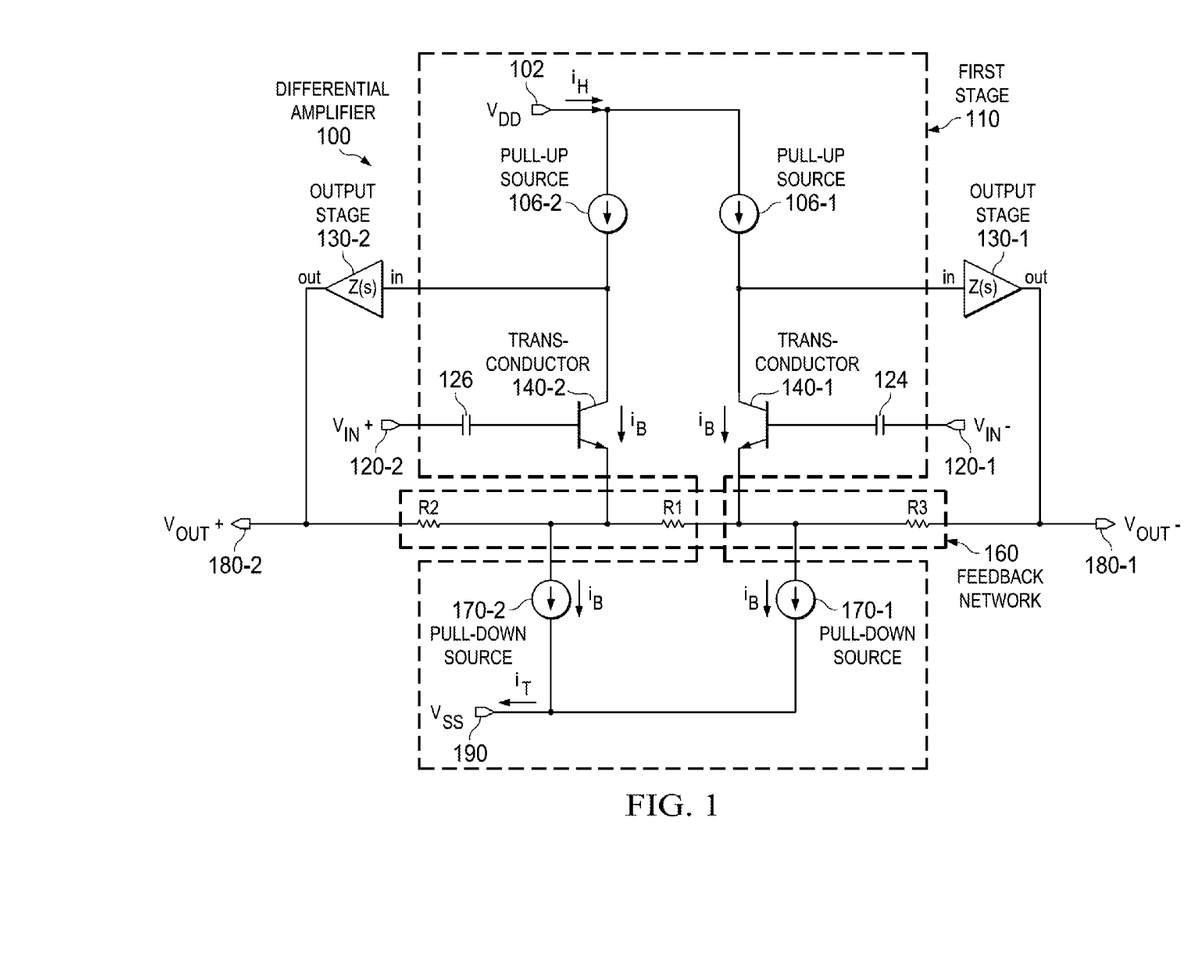
FIG. 1 is an electrical schematic of a differential amplifier according to one or more examples of the present Specification.

FIG. 1 is an electrical schematic disclosing a differential amplifier 100 according to one or more examples of the present Specification. Differential amplifier 100 includes two pull-up current sources 106. Pull-up source 106-1 and pull-up source 106-2 are provided in two substantially symmetrical branches in this example, with each pull-up source providing a biasing current $i_B$. The two sources together provide a total pull-up current $i_H=2i_B$. Similarly, two pull-down current sources 170 are provided. Pull-down source 170-1 and pull-down source 170-2 may provide pull-down currents that are substantially matched to the pull-up currents, so that total pull-down current provided by the two pull-down sources $i_T=i_H=2i_B$. It should also be noted that pull-up and pull-down currents are provided as examples of bias currents. Thus, each branch of amplifier's first stage 110 draws a current $i_B$ from positive supply voltage $V_{DD}$ 102, to negative supply voltage $V_{SS}$ 190. The total power dissipation of amplifier's first stage 110 is $P=i_H(V_{DD}-V_{SS})=2i_B(V_{DD}-V_{SS})$.

Differential amplifier 100 also includes a first stage 110, an output stage 130 for each branch, and a feedback network 160.

First stage 110 receives an input $v_{in}$ 120, comprising $v_{in}^+$ 120-2 and $v_{in}^-$ 120-1. On the positive branch, $v_{in}^+$ 120-2 is coupled to transconductor 140-2 via coupling capacitor 126. Transconductor 140-2 produces a signal output current in response to the signal difference between the $v_{in}^+$ 120-2 voltage signal at its base node and the voltage signal at its emitter node, and provides the output signal current to output stage 130-2. Output stage 130-2 may be provided, for example, to deliver the current necessary to drive the resistor R2 and additional external circuitry connected to terminal 180-2, or for example to provide signal gain from the collector node of transconductor 140-2 to the output terminal $v_{out}^+$ 180-2. Output stage 130-2 provides at its output terminal $v_{out}^+$ 180-2, which feeds back to the emitter of transconductor 140-2 via feedback resistor R2.

On the negative branch, $v_{in}^-$ 120-1 is coupled to transconductor 140-1 via coupling capacitor 124. Transconductor 140-1 amplifies $v_{in}^-$ 120-1 at its base node and provides the amplified signal to output stage 130-1. Output stage 130-1 may be provided, for example, to increase the output power at of $v_{out}$ 180. Output stage 130-1 provides at its output terminal $v_{out}^-$ 180-1, which is also fed back to the emitter of transconductor 140-1 via feedback resistor R3.

Feedback resistor R1 couples the emitter nodes of transconductors 140 to one another. In the absence of an input signal, a given node in one branch of first stage 110 has the same voltage at the corresponding node on the opposite branch. Thus, each transconductor 140 should experience the same voltage at its emitter node, meaning that no current will flow through resistor R1 until a non-zero input signal is applied, at which point the two branches will develop a difference in voltages, and current will flow through resistor R1.

Figure 2:
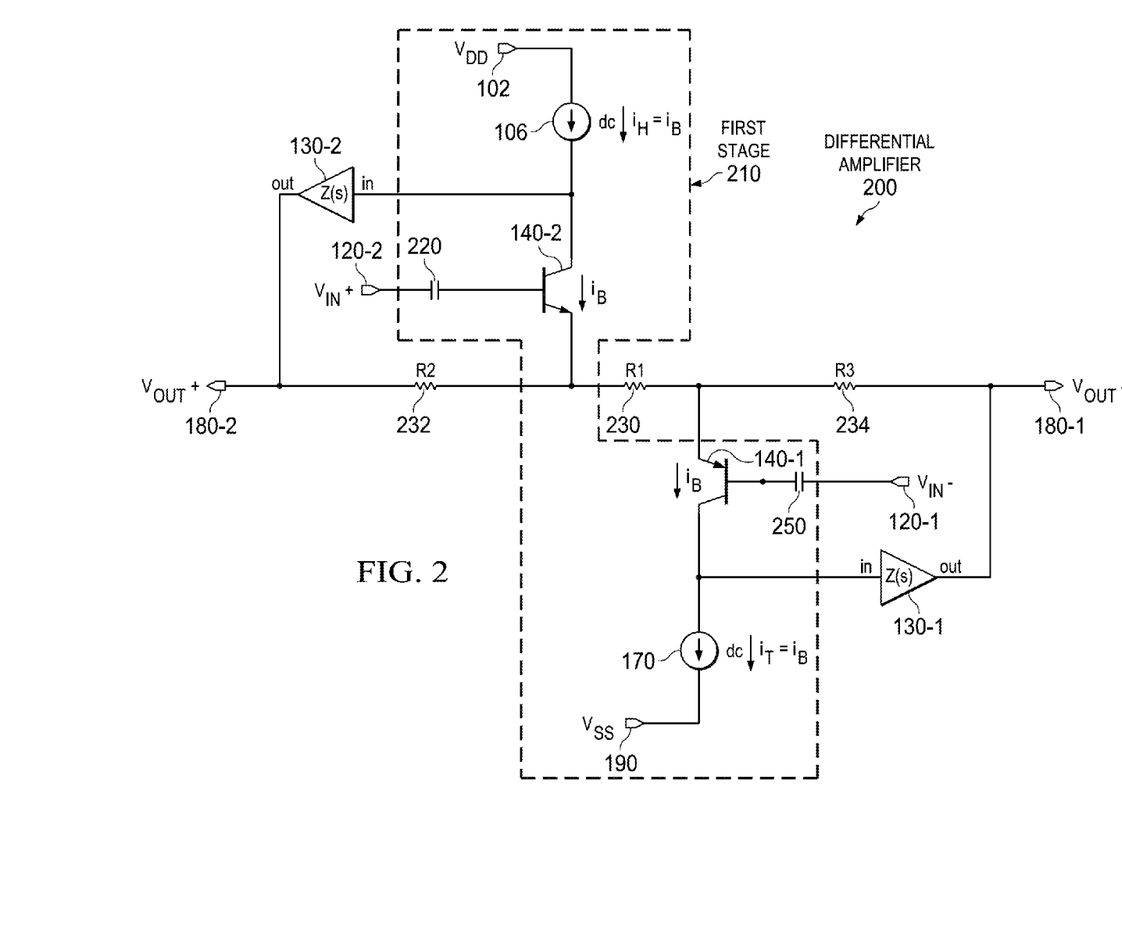
FIG. 2 is an electrical schematic of a differential amplifier according to one or more examples of the present Specification.

FIG. 2 is an electrical schematic of a differential amplifier 200 according to one or more examples of the present Specification. Differential amplifier 200 of FIG. 2 arranges both branches of differential amplifier 200 in series such that the current that is used to bias the transconductor 140-2 in one branch of differential amplifier 200 is substantially reused to bias the transconductor 140-1 on the other branch of differential amplifier 200. Pull-up current source 106 provides pull-up current $i_H$ from $V_{DD}$ 102, which biases transconductors 140. This current is drawn by pull-down current $i_T$ into $V_{SS}$ 190. The total power dissipation of amplifier's first stage 210 is $P=i_H(V_{DD}-V_{SS})=i_B(V_{DD}-V_{SS})$ instead of $2i_B(V_{DD}-V_{SS})$. Note however that this result is not achieved for "free." Additional voltage headroom between $V_{DD}$ 102 and $V_{SS}$ 190 is consumed. This may be readily available in some embodiments, in particular, where differential amplifier 200 provides a gain that is greater than unity from input $v_{in}$ 120 to output $v_{out}$ 180, and if, for purposes of convenience and design simplicity, the input stage and output stages 130 share supply voltages $V_{DD}$ 102 and $V_{SS}$ 190. These supply voltages may be selected according to the dynamic range of output stages 130, which may be substantially greater than the dynamic range of the input stage, thus providing the necessary headroom to enable the series arrangement disclosed in this embodiment.

The positive branch of differential amplifier 200 includes amplifier transconductor 140-2, which is AC coupled to $v_{in}^+$ 120-2 via coupling capacitor 220. The collector node of transconductor 140-2 is electrically coupled to output stage 130-2, which provides $v_{out}^+$ 180-2. $v_{out}^+$ 180-2 feeds back to the emitter node of transconductor 140-2 via a feedback resistor R2 232.

The negative branch of differential amplifier 200 includes amplifier transconductor 140-1, which is AC coupled to $v_{in}^-$ 120-1 via coupling capacitor 250. The collector node of transconductor 140-1 is electrically coupled to output stage 130-1, which provides $v_{out}^-$ 180-1. $v_{out}^-$ 180-1 feeds back to the emitter node of transconductor 140-1 via a feedback resistor R3 234.

It will be appreciated that in this embodiment, differential amplifier 200 includes only one transconductor 140 in either branch of the amplifier's first stage 310. This arrangement will be discussed with greater detail in connection with FIGS. 4 and 5.

Figure 3:
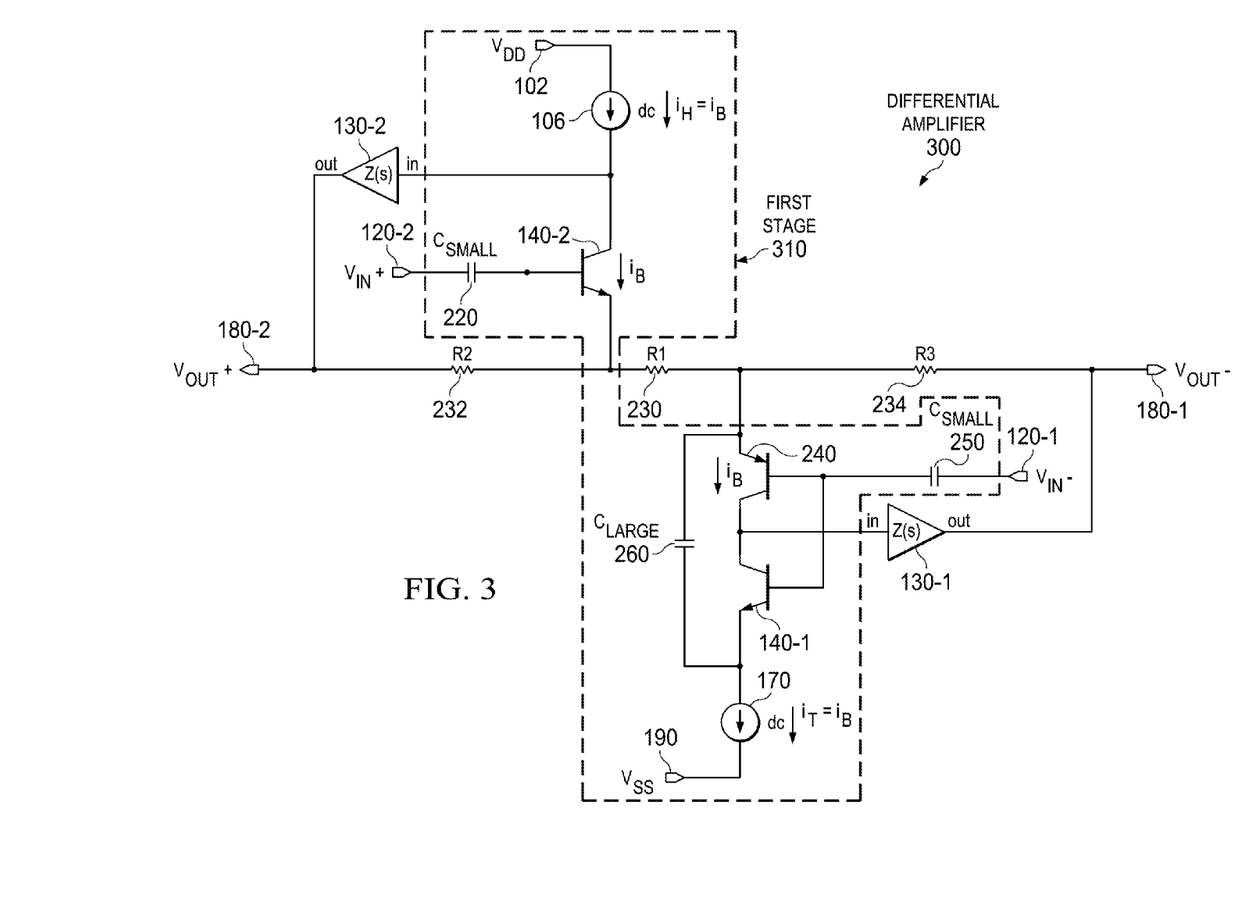
FIG. 3 is an electrical schematic of a differential amplifier according to one or more examples of the present Specification.

FIG. 3 is an electrical schematic of a differential amplifier 300 according to one or more examples of the present Specification. Differential amplifier 300 receives positive supply voltage $V_{DD}$ 102 and negative supply voltage $V_{SS}$ 190. Pull-up source 106 provides a pull-up current $i_H$ drawn from $V_{DD}$ 102, while pull-down source 170 sinks pull-down current $i_T$ to $V_{SS}$ 190.

Amplifier transconductor 140-2 is substantially identical to transconductor 140-2 of differential amplifier 200 of FIG. 2. Amplifier transconductor 140-2 is coupled to $v_{in}^+$ 120-2 via a relatively small capacitor 220, which acts as an AC coupling capacitor. It should be noted that the reference to "small capacitor" 220 is in comparison to capacitor 260 within the circuit. In certain embodiments, all of the capacitors disclosed in FIG. 3 may have relatively large capacitances, particularly with reference to being implemented in an integrated circuit, where surface area may be at a premium and where increased capacitor values consume significant space on the silicon wafer. Amplifier transconductor 140-2 has a collector node electrically coupled to output stage 130-2, which provides $v_{out}^+$ 180-2. The output node of output stage 130-2 is electrically coupled via feedback resistor R2 232 to the emitter node of transconductor 140-2.

The negative branch of differential amplifier 300 is similar but not identical to the negative branch of differential amplifier 200 of FIG. 2. In particular, the negative branch of differential amplifier 300 incorporates an additional transconductor 140-1 which is disposed in series with transconductor 240 so that same current that flows from the emitter of 240 to its collector flows from the collector of 140-1 to its emitter; thereby having bias current $i_B$ bias two transconductors within the negative branch of differential amplifier 300. This enables transconductors on both branches to be biased by a single bias current $i_B$, as was the case in differential amplifier 200 of FIG. 2, and additionally have this current bias two transconductors within the negative branch of differential amplifier 300, as opposed to only one, which was the case in differential amplifiers 100 of FIG. 1 and 200 of FIG. 2. Since a total bias current of value $i_B$ biases three transconductances in differential amplifier 300, rather than the two it biases in differential amplifier 200 of FIG. 2 and the one it biases in differential amplifier 100, amplifier 300 realizes better noise characteristics with $i_H=i_B$ than amplifier 200 of FIG. 2 realizes with the same $i_H=i_B$ and better noise characteristic than differential amplifier 100 realizes with $i_H=2i_B$. Note that, as was the case for differential amplifier 200 of FIG. 2, this result is not achieved for "free" because additional voltage headroom between $V_{DD}$ 102 and $V_{SS}$ 190 is consumed, but that this may be readily available in some embodiments.

Differential amplifier 300 includes amplifier transconductor 140-1, and also provides a third amplifier transconductor 240. In this example, transconductor 140-1 is a npn-type BJT, while transconductor 240 is a pnp-type BJT. It should be noted, however, that in some embodiments other types of transconductors may be used to similar effect. In this case, transconductors 140-1 and 240 are directly DC coupled at their base nodes and at their collector nodes and directly AC coupled at the emitter nodes, thus providing substantially a single transconductance $g_m=g_{m,140-1}+g_{m,240}$.

The base nodes of transconductors 140-1 and 240 are both AC coupled by a small capacitor 250 to input voltage $v_{in}^-$ 120-1, thus receiving one branch of a differential input signal or sensing the voltage to which input $v_{in}^+$ 120-2 is referred if the input signal is single-ended. Output stage 130-1 provides one branch of the output voltage $v_{out}^-$ 180-1. $v_{out}^-$ 180-1 is coupled to the emitter nodes of transconductor 240 and transconductor 140-1, DC coupled in a feedback configuration via feedback resistor R3 234 to the emitter of transconductor 240, and AC coupled in a feedback configuration via feedback resistor R3 234 and AC coupling capacitor 260 to the emitter of transconductor 140-1. The use of two transconductors in this embodiment will be discussed in greater detail in connection with FIGS. 7, 8, and 9.

In this embodiment, $i_T=i_H$ substantially so that a substantially constant, steady-state bias current flows through transconductors 140 and 240 of the amplifier stage. Unlike differential amplifier 100 of FIG. 1, however, differential amplifier 300 has transconductors 140-1 and 140-2 arranged in series with one another. Thus, for bias current $i_B$ to flow through both branches of the amplifier, $i_H=i_T=i_B$ rather than $i_H=i_T=2i_B$. The total power dissipation of amplifier's first stage 310 is $P=i_H(V_{DD}-V_{SS})=i_B(V_{DD}-V_{SS})$ instead of $2i_B(V_{DD}-V_{SS})$. Additionally unlike differential amplifier 200 of FIG. 2, differential amplifier 300 has three transconductors, rather than two, arranged to share the same bias current. Thus, for bias current $i_B$ flowing through both branches of the differential amplifiers 300 and 200 $i_H=i_T=i_B$ in both cases and the total power dissipation of these amplifiers' first stages 310 and 210 is $P=i_H(V_{DD}-V_{SS})=i_B(V_{DD}-V_{SS})$ in both cases, but first stage 310 has greater transconductance than first stage 210, and therefore differential amplifier 300 has lower noise than differential amplifier 200 of FIG. 2.

Figure 4:
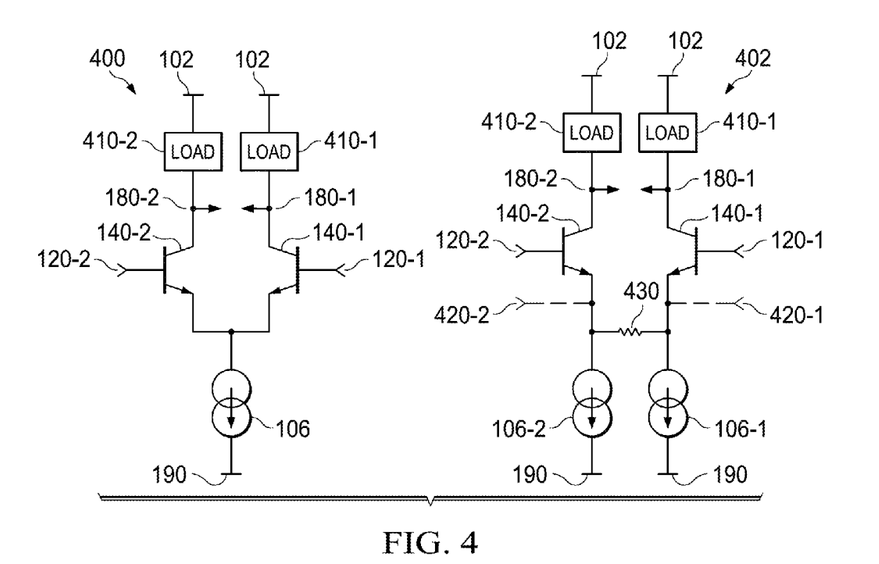
FIG. 4 includes electrical schematics for two species of differential amplifiers according to one or more examples of the present Specification.

FIG. 4 is a partial electrical schematic of two differential amplifiers 400 and 402 according to one or more examples of the present Specification. Differential amplifiers 400 and 402 are provided for comparison purposes.

Differential amplifier 400 is a known configuration for differential amplifiers. In this case, differential amplifier 400 receives an input including $v_{in}^-$ 120-1 and $v_{in}^+$ 120-2, which is amplified via transconductors 140-1 and 140-2 and loads 410-1 and 410-2. Output signals $v_{out}^-$ 180-1 and $v_{out}^+$ 180-2 are provided at the respective collector nodes of transconductors 140-1 and 140-2. A differential load 410 is provided, wherein $v_{out}^-$ 180-1 is provided to negative branch 410-1 of differential load 410, while $v_{out}^+$ 180-2 is provided to positive branch 410-2 of differential load 410.

In this example, differential amplifier 400 comprises transconductors 140-1 and 140-2 arranged in an emitter-coupled differential pair configuration, wherein the only inputs are provided on the respective bases of the two transconductors 140.

Differential amplifier 402 discloses another embodiment of a known differential amplifier. Differential amplifier 402 is nearly identical to differential amplifier 400, but in this case, a resistor 430 is provided between the emitter nodes of transconductors 140.

Comparing differential amplifier 400 to differential amplifier 402, differential amplifier 400 has increased linearity. In particular, transconductors 140 of differential amplifier 400 may have very high gain, but the gain is very much nonlinear. By providing resistor 430 between the emitter nodes of transconductors 140-1 and 140-2, some of the gain is traded for increased linearity.

Differential amplifier 402 may optionally be adapted to receive a second input 420, comprising negative branch 420-1 and positive branch 420-2 in addition to input 120. In this case, the amplifier can be configured in a feedback configuration with input 120 accepting a input signal, input 420 accepting a feedback signal, and resistor 430 being part of the resistive feedback network that is used to sense the output voltage, scale it down, and subtract it from the amplifier input In the case of two independent differential inputs to differential amplifier 402, resistor 430 forms a part of feedback network 160 as disclosed in FIGS. 1-3. It should be noted that in certain embodiments, resistor 430 may correspond substantially to resistors R1 of FIG. 1 and 230 of FIGS. 2 and 3. In this case, resistor 430 is helping to feedback output voltage $v_{out}$ 180 to input terminals 420. Resistors R2 and R3 of FIG. 1 may also be present, but in the case of differential amplifier 402, the feedback signal may be provided at the emitter nodes of transconductors 140 rather than at the base nodes of transconductor 140.

It should also be noted that in the absence of any input signal, the two branches of differential amplifier 402 are substantially symmetrical. Thus, current should flow through current sources 106, but no current should flow through resistor 430, because there should be no voltage difference between the emitter nodes of transconductors 140-1 and 140-2.

Figure 5:
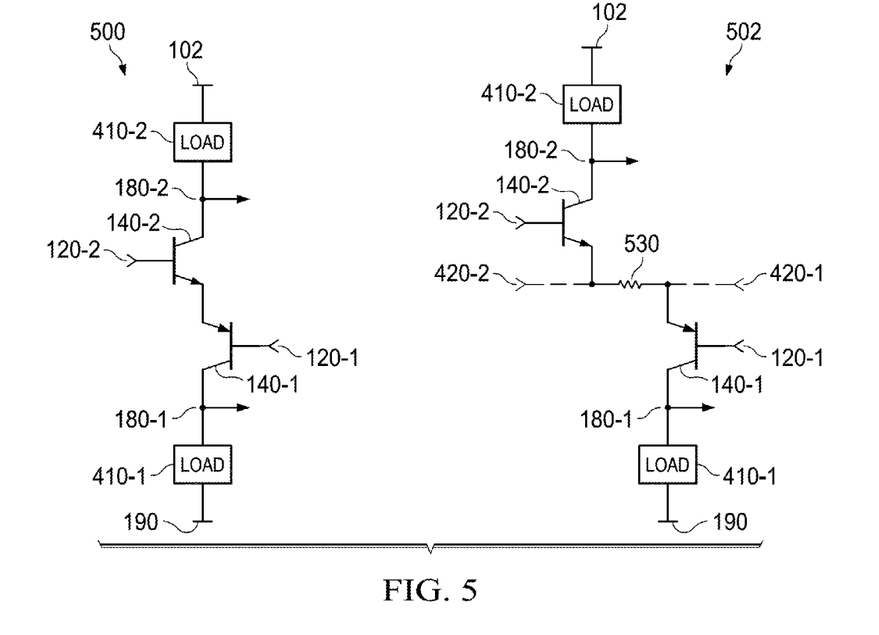
FIG. 5 includes electrical schematics for two species of differential amplifiers according to one or more examples of the present Specification.

FIG. 5 is an electrical schematic of two differential amplifiers 500 and 502 according to one or more examples of the present Specification. In this example, differential amplifier 500 corresponds substantially to differential amplifier 400 of FIG. 4. But in the case of differential amplifier 500, the amplifier stages are arranged in series such that the current that is used to bias the transconductor 140-2 in one branch of differential amplifier 500 is substantially reused to bias the transconductor 140-1 on the other branch of differential amplifier 500 unlike differential amplifier 400 of FIG. 4 where the current that is used bias the transconductor 140-2 in one branch of differential amplifier 400 is not reused to bias the transconductor 140-1 on the other branch of differential amplifier 400. Similarly, differential amplifier 502 corresponds substantially to differential amplifier 402 of FIG. 4. But in the case of differential amplifier 502, the amplification stages are arranged in series such that the current that is used to bias the transconductor 140-2 in one branch of differential amplifier 502 is substantially reused to bias the transconductor 140-1 on the other branch.

In the case of differential amplifier 500, transconductor 140-1 is reversed in polarity. By way of example, we can assume that each transconductor requires approximately 1 mA bias current to operate at a target noise level. In the embodiment of differential amplifier 400, a total of 2 mA pull-up current needs to be sourced by loads 410 to provide 1 mA current to each branch of differential amplifier 400. In contrast, in the case of differential amplifier 500, only 1 mA pull-up current needs to be sourced by load 410-2 to provide a bias of 1 mA to each branch and this same current is sank by load 410-1. However, differential amplifier 500 of FIG. 5 may require a greater voltage difference between $V_{DD}$ 102 and $V_{SS}$ 190 to accommodate the headroom voltage required by the series combination. As noted above, in cases where differential amplifier 500 is used in the input stage of an amplifier circuit as well as other cases, the additional headroom may already be available.

Turning to differential amplifier 502, it is again noted that transconductor 140-1 has a reverse polarity. While differential amplifier 502 may be configured to have substantially the same amplification properties as differential amplifier 402, and like differential amplifier 402 provides inputs 120-1, 120-2, 420-1, and 420-2, it will be noted that because of this series arrangement, in the absence of an input signal, biasing current $i_B$ flows through resistor 530. This causes a voltage drop across resistor 530, meaning that differential amplifier 502 will not have the same quiescent properties as differential amplifier 402. In some cases, it may be desirable to compensate for the quiescent voltage across resistor 530.

Figure 6:
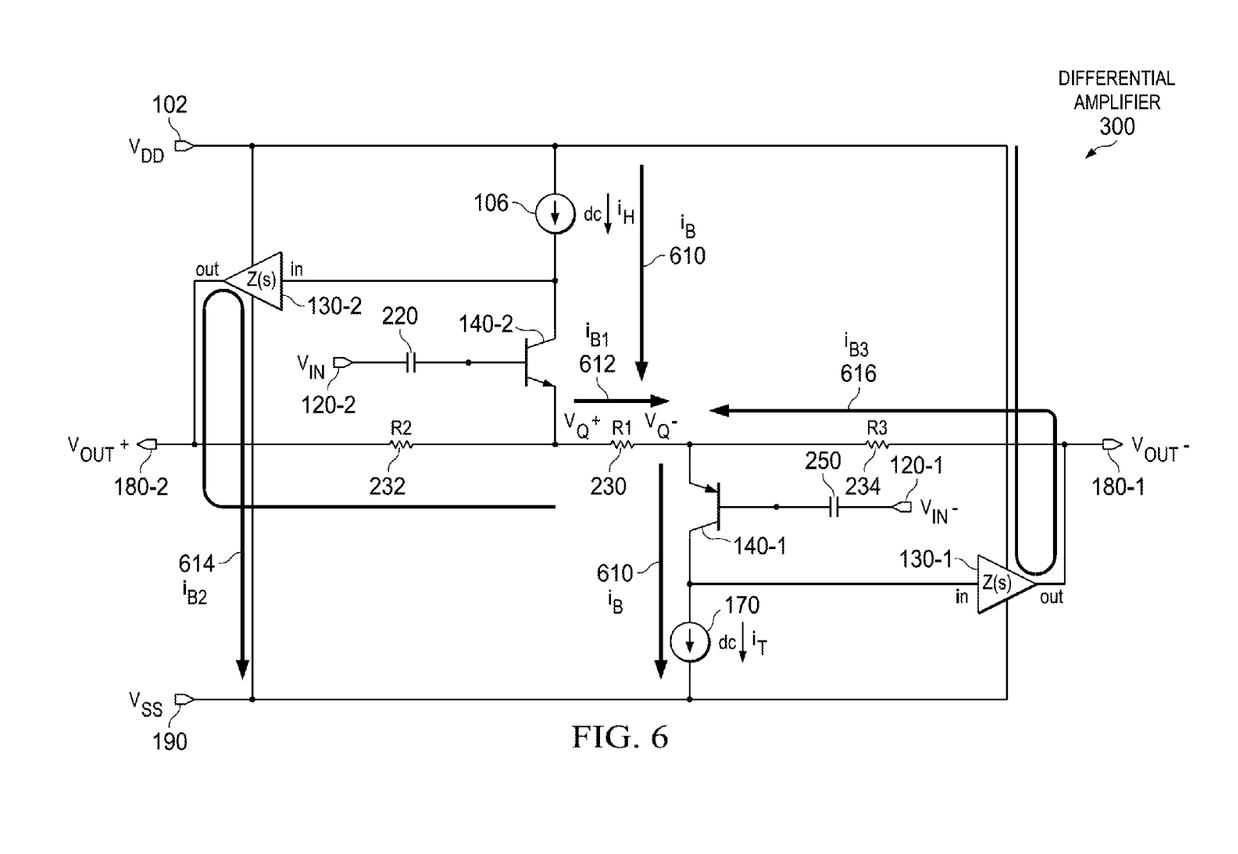
FIG. 6 is an electrical schematic of a differential amplifier according to one or more examples of the present Specification.

FIG. 6 is an electrical schematic of a differential amplifier 300 showing compensation for a quiescent voltage across resistor 230, similar to the situation discussed with respect to differential amplifier 502 of FIG. 5.

As in FIG. 3, differential amplifier 300 of FIG. 6 is disclosed with positive supply voltage $V_{DD}$ 102 and negative supply voltage $V_{SS}$ 190. A single pull-up current source 106 provides $i_H=i_B$, while a single pull-down source 170 provides $i_T=i_B$.

$v_{in}^+$ 120-2 is AC coupled to transconductor 140-2 via a coupling capacitor 220. Output stage 130-2 provides $v_{out}^+$ 180-2, which feeds back to transconductor 140-2 via feedback resistor R2 232. Similarly, $v_{in}^-$ 120-1 is AC coupled to transconductor 140-1 via capacitor 250. Transconductor 140-1 provides its output to output stage 130-1, which provides $v_{out}^-$ 180-1. $v_{out}^-$ 180-1 feeds back to transconductor 140-1 via feedback resistor R3 234.

In the example of FIG. 6, the issue described with respect to differential amplifier 502 of FIG. 5 may be more easily understood. In this case, a single bias current $i_B$ 610 is provided to transconductors 140-1 and 140-2. A quiescent current $i_{B1}$ flows through resistor R1 230, developing a quiescent voltage drop $v_Q=i_{B1}R1$. Thus, in the absence of a signal, differential amplifier 300 looks and behaves internally as though there were a signal applied.

In certain embodiments, and in particular where it is desirable for differential amplifier 300 to behave similarly to differential amplifier 100 of FIG. 1, it is desirable to compensate for offset $v_Q$. In an example, $v_Q$ may be compensated for providing voltage drops of opposite polarity across resistors 232 and 234 so that $v_{out}^+$ 180-2 equals $v_{out}^-$ 180-1 when $v_{in}^+$ 120-2 equals $v_{in}^-$ 120-1. In certain embodiments, resistors 232 and 234 may each be significantly larger than resistor R1 230. For example, resistors R2 232 and R3 234 may each be approximately 10 times larger than resistor R1 230. Thus, only a relatively small fraction of $i_B$ needs to be diverted through R2 232 and R3 234 to offset $v_Q$.

In an example, if R2 232 is 10 times larger than R1 230 and R3 234 is 11 times larger than R1 230, then the quiescent currents $i_{B2}$ and $i_{B3}$ through resistors R2 232 and R3 234 respectively are $$i_{B2} = i_{B3} = \frac{1}{22} i_B.$$

In some embodiments, R3 234 may have a slightly different resistance from R2 232. In this case, the value of R3 234 may be for example R3=R2+R1. For example, if we select R1=1 kΩ, we may select R2=10 kΩ. In that case, we may have R3=R2+R1=10 kΩ+1 kΩ=11 kΩ. This configuration provides for a single ended input to be able to drive the amplifier inputs 120 and the circuit is not strictly symmetrical. Note, however, that where design constraints dictate that only differential inputs may be received by differential amplifier 300, the circuit may have R3=R2 and therefore be symmetrical.

Thus, in this embodiment, a small fraction of bias current $i_B$ is sacrificed, along with an attendant fractional increase in power dissipation, to compensate for $v_Q$. In certain embodiments, this tradeoff is acceptable because $i_{B2}=i_{B3}\ll i_B$. In other words, the efficiencies realized by using a series arrangement in differential amplifier 300 may be substantially greater than the configuration of differential amplifier 100 of FIG. 1, even when it is necessary to sacrifice some bias current to offset $v_Q$.

Figure 7:
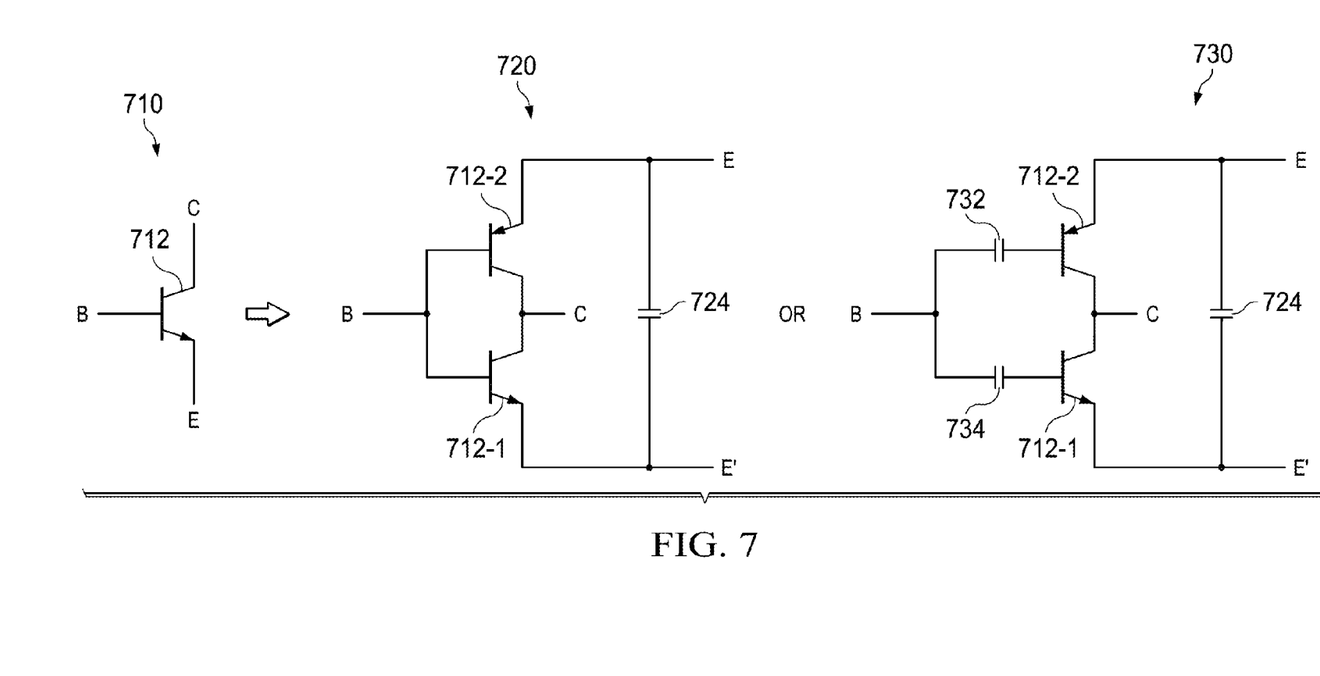
FIG. 7 is an electrical schematic of methods of combining transconductors according to one or more examples of the present Specification.

FIG. 7 is a series of electrical schematics disclosing a method of providing a single, combined transconductance by means of a plurality of transconductors. These are referred to herein as transconductance 710, transconductance 720, and transconductance 730.

In the case of transconductance 710, only a single physical transconductor 712 provides the total transconductance. Transconductor 712 is, by way of example, an npn-type BJT and includes each of a single base, collector, and emitter node, labeled B, C, and E respectively.

In the example of transconductance 720, two physical transconductors 712-1 and 712-2 are used to double the effective transconductance of 720. This technique is used in FIG. 2 for differential amplifier 200. Notably, compared to transconductance 710, transconductance 720 will realize substantially lower noise with the same bias current, because noise depends inversely on the transconductance and $g_{m,720}=2g_{m,710}$ substantially. It should be noted that transconductor 712-2 is a pnp-type BJT by way of example, but more generically is of opposite polarity to transconductor 712-1. In this case, the collector nodes of transconductors 712-1 and 712-2 are directly DC-coupled at node C. The base nodes of the transconductors 712-1 and 712-2 are directly DC coupled at node B. The emitter nodes of transconductor 712-1 and 712-2 are AC-coupled by coupling capacitor 724 at nodes E and E'. This configuration is appropriate, in particular, in cases where a single bias voltage is applied at the base of both transconductors.

Transconductance 730 provides yet another example of a transconductance provided by two physical transconductors 712-1 and 712-2. Once again, transconductor 712-2 has opposite polarity to transconductor 712-1, and both transconductors are directly coupled at their collectors at node C. Also as in transconductor 720, transconductors 712-1 and 712-2 are AC coupled at their emitter nodes by coupling capacitor 724.

In the case of transconductance 730, transconductors 712-1 and 712-2 are AC coupled at their base nodes by coupling capacitors 732 and 734. This allows transconductors 712-1 and 712-2 to receive different DC biasing voltages at their bases to independently optimize their bias point.

Transconductances 720 and 730 each provide twice the effective transconductance of transconductance 710, while drawing the same current, thus decreasing noise without increasing current. This is so because the bias current for transconductor 712-2, which flows from emitter of 712-2 to collector of 712-2 is reused to bias transconductor 712-1 by flowing from collector of 712-1 to emitter of 712-1.

For example, transconductance 710 may realize a particular noise rating with a transconductance value of $g_m$, biased with a current $i_B$. Transconductances 720 and 730 may realize the same noise rating with effective transconductance value $g_m$ and a bias current of $$\frac{1}{2} i_B.$$

Figure 8:
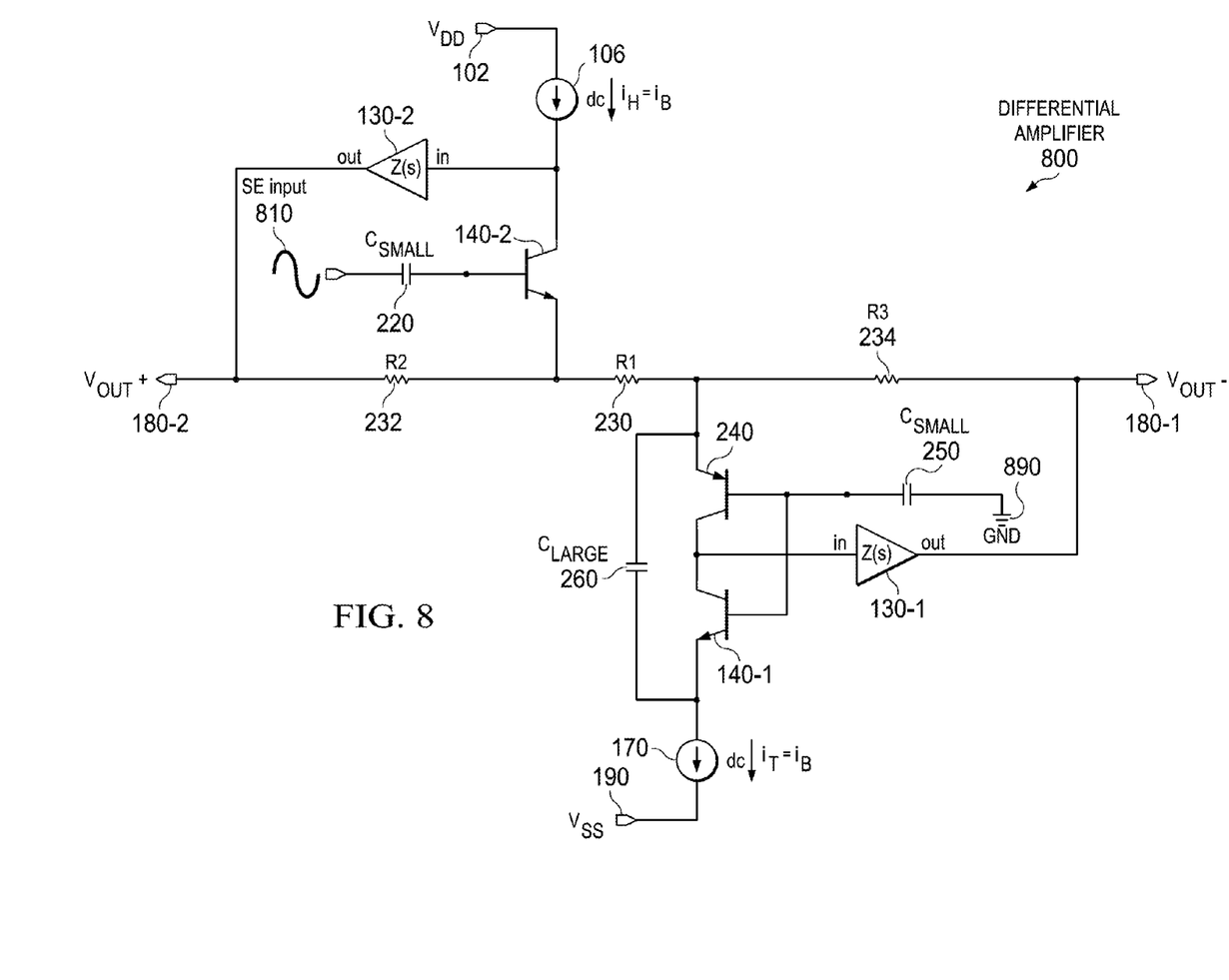
FIG. 8 is an electrical schematic of a differential amplifier according to one or more examples of the present Specification.

FIG. 8 is an electrical schematic of a differential amplifier 800 according to one or more examples of the present Specification. In this example, differential amplifier 800 is configured to receive a single-ended (SE) input 810 at the input node of transconductor 140-2. SE input 810 is AC coupled to transconductor 140-2 via small capacitor 220. As before, a single pull-up source 106 sources bias current $i_H=i_B$ from positive supply $V_{DD}$ 102. Pull-down source 170 sources a pull-down current $i_T=i_B$ to negative supply $V_{SS}$ 190. The output of transconductor 140-2 is connected to output stage 130-2, which provides $v_{out}^{-+}$ 180-2. $v_{out}^+$ 180-2 is fed back to the emitter of transconductor 140-2 via feedback resistor 232.

On the negative branch of differential amplifier 800, transconductors 140-1 and 240 are DC-coupled at their base nodes. In this case, the base nodes of transconductors 140-1 and 240 are AC-coupled to ground 890 via small capacitor 250. A large capacitor 260 AC couples the emitter nodes of transconductors 140-1 and 240. The collector nodes of transconductors 140-1 and 240 are DC coupled, and provided to output stage 130-1, which provides $v_{out}^-$ 180-1. $v_{out}^-$ 180-1 feeds back to transconductors 140-1 and 240 via feedback resistor 234.

The configuration of differential amplifier 800 illustrates that transconductances 720 and 730 of FIG. 7 do not come free of cost. For example, transconductances 720 and 730 may have a reduced capacity to handle large signals. Thus, transconductances 720 and 730 may be especially useful for embodiments like differential amplifier 800 where one of the signal inputs is grounded.

On the other hand, if a time-variant signal is provided to transconductors 140-1 and 240 in FIG. 3, then $v_{out}^+$ 180-2 and $v_{out}^-$ 180-1 may have a reduced dynamic range. Specifically, when $v_{in}^-$ 120-1 is high, transconductor 140-1 may saturate. When $v_{in}^-$ 120-1 goes low, transconductor 240 may saturate. When transconductors 140-1 or 240 saturate, they may stop amplifying and may substantially distort the peaks and valleys of $v_{out}^+$ 180-2 and $v_{out}^-$ 180-1.

Nevertheless, transconductor pairs may be used on both branches of differential amplifier 800 in cases where input waveforms are within acceptable limits, or in applications were clipping distortion is acceptable, while low noise for lower-amplitude signals is at a premium. Thus, it is within the skill of a practitioner in the art to select a design that is appropriate for constraints of a particular embodiment.

Figure 9:
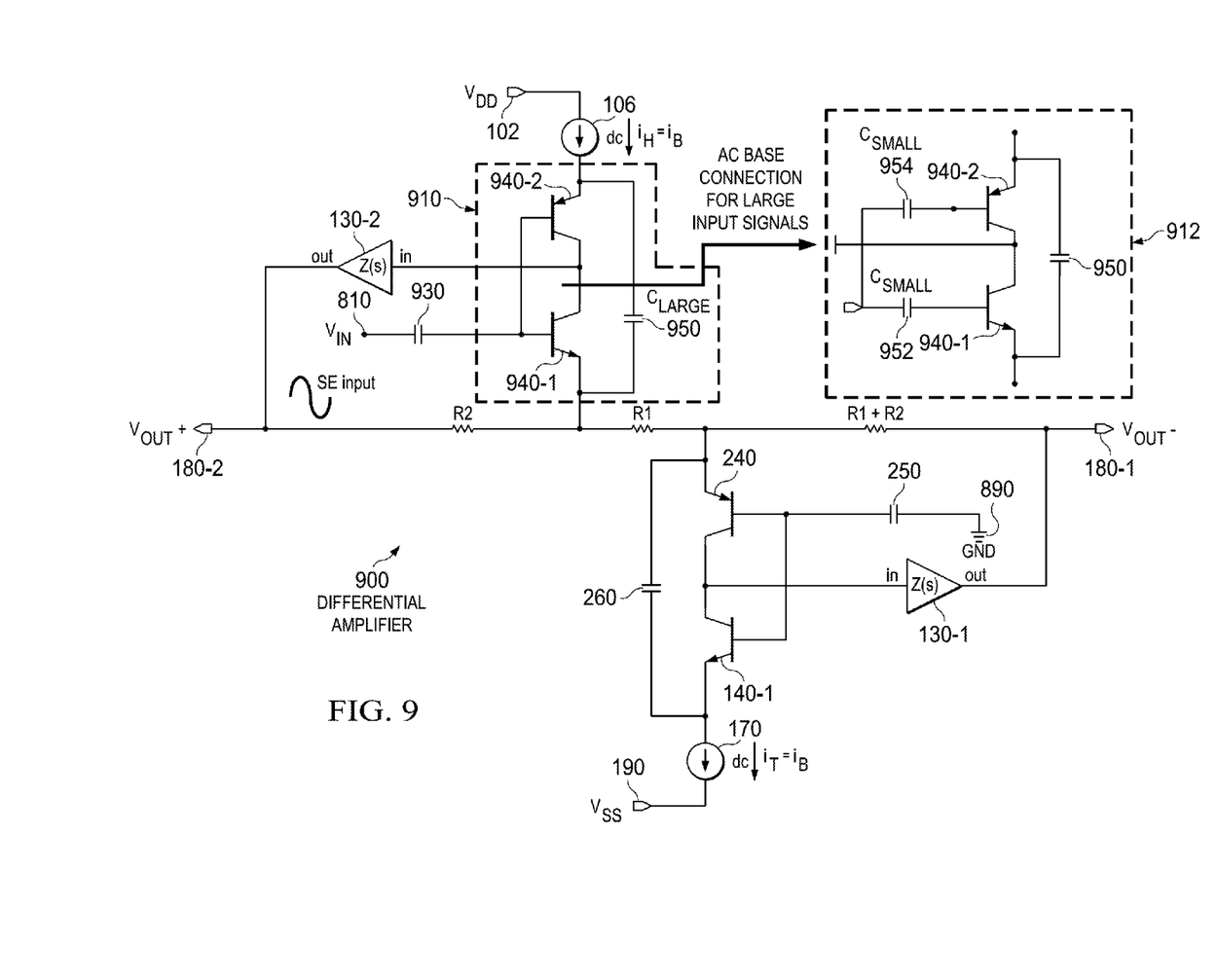
FIG. 9 is an electrical schematic of a differential amplifier according to one or more examples of the present Specification.

FIG. 9 is an electrical schematic of a differential amplifier 900 disclosing a situation where transconductor pairs may be used on both branches of the amplifier's first stage. The negative branch of differential amplifier 900 is substantially identical to the negative branch of differential amplifier 800 FIG. 8. As before, transconductors 140-1 and 240 are AC coupled to ground 890 via coupling capacitor 250. Thus, no input is provided at these nodes.

In the case of the positive branch, $v_{in}$ 810, which is a single ended input, is provided at the base nodes of transconductor 940-1 and 940-2 in amplifier stage 910. In this case, a small capacitor 930 may be used to AC couple $v_{in}$ 810 to transconductors 940-1 940-2. The arrangement of transconductors 940-1 and 940-2 are otherwise substantially identical to transconductor pair 720 of FIG. 7. This configuration may be acceptable where single ended input 810 provides a small signal, so that the transconductors do not saturate.

In an alternative amplifier stage 912, transconductors 940-1 and 940-2 are AC coupled at their respective base nodes via small capacitor 952 and small capacitor 954. In this case, separate DC bias voltages may be applied at the base of each transconductor. This may help to avoid saturating either transconductor in the presence of relatively large input signals, at the expense of some additional complexity. This provides a greater dynamic input range.

The embodiment of differential amplifier 300 is desirable particularly in an integrated circuit, because capacitors used throughout this Specification are relatively large to integrated circuits and so consume significant surface area. Thus, it is desirable in integrated circuits to reduce the number of capacitors. However, in certain embodiments, the increased surface area is acceptable, and it is therefore acceptable to provide within the amplification stage.

In other embodiments, capacitors 952, 954, and 930 may be placed outside of an integrated circuit, where they can be, for example, surface mounted or through-hole mounted on a printed circuit board (PCB). This again raises a question of design constraints and consideration. For example, if capacitors are provided externally, then differential amplifier 900 may be suitable, and requires only a single input for both base nodes of transconductors 940-1 and 940-2. However, if amplification stage 912 is provided, then to place coupling capacitors 952 and 954 on an external PCB, separate input pins are required for each of transconductor 940-1 and transconductor 940-2. This is further exacerbated when a plurality of separate differential amplifiers, for example eight to sixteen differential amplifiers, are placed in a single integrated circuit. In this case, the number of input pins is doubled for each amplifier. In some design examples, this may be unacceptable, while in other design examples, it may be acceptable. It should also be noted that increasing the number of pins or increasing or varying the performance characteristics may not be acceptable in cases where an integrated circuit is designed to be a drop-in replacement for an existing integrated circuit. In that case, backward compatibility may need to be maintained. Thus it will be within the skill of a system designer to select an appropriate design.

Note that the activities discussed above with reference to the FIGURES are applicable to any integrated circuits that involve signal processing or amplification, particularly those that can execute specialized software programs or algorithms, some of which may be associated with processing digitized real-time data. Certain embodiments can relate to multi-DSP signal processing, floating point processing, signal/control processing, fixed-function processing, microcontroller applications, etc. In certain contexts, the features discussed herein can be applicable to medical systems, scientific instrumentation, wireless and wired communications, radar, industrial process control, audio and video equipment, current sensing, instrumentation (which can be highly precise), and other digital-processing-based systems.

Moreover, certain embodiments discussed above can be provisioned in digital signal processing technologies for medical imaging, patient monitoring, medical instrumentation, and home healthcare. This could include pulmonary monitors, accelerometers, heart rate monitors, pacemakers, etc. Other applications can involve automotive technologies for safety systems (e.g., stability control systems, driver assistance systems, braking systems, infotainment and interior applications of any kind). Furthermore, powertrain systems (for example, in hybrid and electric vehicles) can use high-precision data conversion products in battery monitoring, control systems, reporting controls, maintenance activities, etc. In yet other example scenarios, the teachings of the present disclosure can be applicable in the industrial markets that include process control systems that help drive productivity, energy efficiency, and reliability. In consumer applications, the teachings of the signal processing circuits discussed above can be used for image processing, auto focus, and image stabilization (e.g., for digital still cameras, camcorders, etc.). Other consumer applications can include audio and video processors for home theater systems, DVD recorders, and high-definition televisions. Yet other consumer applications can involve advanced touch screen controllers (e.g., for any type of portable media device). Hence, such technologies could readily be part of smartphones, tablets, security systems, PCs, gaming technologies, virtual reality, simulation training, etc.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The particular embodiments of the present disclosure may readily include a system on chip (SOC) package. An SOC represents an integrated circuit (IC) that integrates components of a computer or other electronic system into a single chip. It may contain digital, analog, mixed-signal, and radio frequency functions: all of which may be provided on a single chip substrate. Other embodiments may include a multi-chip-module (MCM), with a plurality of chips located within a single electronic package and configured to interact closely with each other through the electronic package. In various other embodiments, functions of the present disclosure may be used in conjunction with or augmented by digital signal processing functionalities, which may be implemented in one or more silicon cores in Application Specific Integrated Circuits (ASICs), Field Programmable Gate Arrays (FPGAs), and other semiconductor chips.

In one example embodiment, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In another example embodiment, the electrical circuits of the FIGURES may be implemented as stand-alone modules (e.g., a device with associated components and circuitry configured to perform a specific application or function) or implemented as plug-in modules into application specific hardware of electronic devices.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "steps for" are specifically used in the particular claims; and (b) does not intend, by any statement in the Specification, to limit this disclosure in any way that is not otherwise reflected in the appended claims.

What is claimed is:

1. A two-branch multi-stage amplifier circuit comprising:
   a first stage, comprising a first-branch transconductance and a second-branch transconductance electrically coupled to the first-branch transconductance;
   wherein the electrical coupling is disposed so that a current $i_H$ flowing into the first-branch transconductance as a bias current $i_{B1}$, where $i_{B1}=i_H$, is provided substantially to the second-branch transconductance as a bias current $i_{B2}=i_{B1}$; and
   a second stage comprising a first second stage branch and a second second stage branch, wherein current flowing into the first second stage branch is not provided to the second second stage branch.

2. The two-branch amplifier circuit of claim 1, wherein the first-branch transconductance and second-branch transconductance constitute a differential transconductance.

3. The two-branch amplifier circuit of claim 1, further comprising a feedback network comprising a plurality of impedance elements.

4. The two-branch amplifier circuit of claim 1, wherein the first-branch transconductance is disposed in series with the second-branch transconductance.

5. The two-branch amplifier circuit of claim 4, further comprising a series impedance element between the first-branch transconductance and the second-branch transconductance.

6. The two-branch amplifier circuit of claim 1, wherein at least one branch transconductance comprises at least a first transconductor and a second transconductor in series with each other.

7. The two-branch amplifier circuit of claim 6, wherein the first transconductor and second transconductor are electrically coupled in a direct current configuration at their respective input nodes.

8. The two-branch amplifier circuit of claim 6, wherein the first transconductor and second transconductor are electrically coupled in an alternating current configuration via a capacitor at their respective input nodes.

9. An integrated circuit comprising:
   a semiconductor die comprising a multi-stage amplifier having a first stage with a first-branch transconductance and a second-branch transconductance electrically coupled to the first-branch transconductance;
   wherein the electrical coupling is disposed so that a current $i_H$ flowing into the first-branch transconductance as a bias current $i_{B1}$, where $i_{B1}=i_H$, is provided substantially to the second-branch transconductance as a bias current $i_{B2}=i_{B1}$; and
   a second stage comprising a first second stage branch and a second second stage branch, wherein current flowing into the first second stage branch is not provided to the second second stage branch.

10. The integrated circuit of claim 9, wherein the first-branch transconductance and second-branch transconductance constitute a differential transconductance.

11. The integrated circuit of claim 9, further comprising a feedback network comprising a plurality of impedance elements.

12. The integrated circuit of claim 9, wherein the first-branch transconductance is disposed in series with the second-branch transconductance.

13. The integrated circuit of claim 12, further comprising a series impedance element between the first-branch transconductance and the second-branch transconductance.

14. The integrated circuit of claim 9, wherein at least one branch transconductance comprises at least a first transconductor and a second transconductor in series with each other.

15. The integrated circuit of claim 14, wherein the first transconductor and second transconductor are electrically coupled in a direct current configuration at their respective input nodes.

16. The integrated circuit of claim 14, wherein the first transconductor and second transconductor are electrically coupled in an alternating current configuration via a capacitor at their respective input nodes.

17. An electronic system comprising:
   a signal source;
   a signal load;
   an input-stage amplifier electrically coupled to the signal source and configured to amplify the signal source, the input-stage amplifier comprising a first-branch transconductance and a second-branch transconductance electrically coupled to the first-branch transconductance, wherein the electrical coupling is disposed so that a current $i_H$ flowing into the first-branch transconductance as a bias current $i_{B1}$, where $i_{B1}=i_H$, is provided substantially to the second-branch transconductance as a bias current $i_{B2}=i_{B1}$; and an output stage configured to provide the amplified signal to the signal load, having a first branch and a second branch, and having a positive supply voltage and a negative supply voltage, wherein the positive supply voltage and negative supply voltage are shared between the input-stage amplifier and the output stage, and wherein current flowing into the first branch of the output stage is not provided substantially to the second branch of the output stage.

18. The electronic system of claim 17, wherein the first-branch transconductance and second-branch transconductance constitute a differential transconductance.

19. The electronic system of claim 17, further comprising a feedback network comprising a plurality of impedance elements.

20. The electronic system of claim 17, wherein the first-branch transconductance is disposed in series with the second-branch transconductance.

21. The electronic system of claim 20, further comprising a series impedance element between the first-branch transconductance and the second-branch transconductance.

22. The electronic system of claim 17, wherein at least one branch transconductance comprises at least a first transconductor and a second transconductor in series with each other.

23. The electronic system of claim 22, wherein the first transconductor and second transconductor are electrically coupled in a direct current configuration at their respective input nodes.

* * * * *